United States Patent [19]

Hoehn

[11] Patent Number: 4,595,912

[45] Date of Patent: Jun. 17, 1986

[54] INTEGRATED CIRCUIT FOR GENERATING A TERMINAL VOLTAGE ADJUSTABLE BY A DIGITAL SIGNAL

[75] Inventor: Wolfgang Hoehn, Kirchzarten, Fed. Rep. of Germany

[73] Assignee: ITT Industries, Inc., New York, N.Y.

[21] Appl. No.: 597,242

[22] Filed: Apr. 5, 1984

[30] Foreign Application Priority Data

Apr. 8, 1983 [EP] European Pat. Off. ........ 83103435.0

[51] Int. Cl.⁴ .............................................. H03M 1/00
[52] U.S. Cl. ............................................. 340/347 DA
[58] Field of Search ................. 340/347 AD, 347 DA

[56] References Cited

U.S. PATENT DOCUMENTS 3,978,473  8/1976  Pastoriza ..................... 340/347 DA
4,408,190 10/1983  Nagano ....................... 340/347 DA

FOREIGN PATENT DOCUMENTS 2054996  2/1981  United Kingdom ........ 340/347 DA

OTHER PUBLICATIONS

"A 12 Bit Monolithic IC D to A Converter", Microelectronics, vol. 3, No. 7, Jul. 70, O'Donoghue, pp. 19-23.
"Dynamic Element Matching for High-Accuracy Monolithic D/A Converters", Van De Plassche, IEEE Journal of Solid State Circuits, vol. SC-11, No. 6, Dec. 1976.
"Analog-Digital Conversion Handbook", pp. I-33-I--34, Analog Devices, Inc. Jun. 1972.

Primary Examiner—Bernard Roskoski
Attorney, Agent, or Firm—Donald J. Lenkszus

[57] ABSTRACT

An integrated circuit is described which includes a digital/analog converter which together with a reference voltage generator and a current-to-voltage converter is driven by a single supply voltage. To obtain a variable output voltage from a second supply voltage, the reference voltage is dependent on this second voltage. The output voltage can be used as the tuning voltage of tuner diodes.

7 Claims, 4 Drawing Figures

INTEGRATED CIRCUIT FOR GENERATING A TERMINAL VOLTAGE ADJUSTABLE BY A DIGITAL SIGNAL

BACKGROUND OF THE INVENTION

This invention pertains to an integrated circuit comprising a binary integrated digital-to-analog converter for generating from the voltage of a voltage source a terminal voltage adjustable with the aid of a digital signal. The printed publication of the firm of Valvo GmbH, entitled "Technische Informationen fur die Industrie", No. 791221, December 1979 describes one such arrangement. In the conventional arrangement, the values of the analog output voltage, i.e., the terminal voltage, may range between 0 and 5 volts, when the integrated digital-to-analog converter with its corresponding external wiring are operated by a positive voltage of 5 volts and a negative voltage of $-15$ volts. However, this terminal voltage range is too small for many applications, for example, for operating varactor diodes in radio and television receivers. In these cases it is desireable to have a terminal voltage range of about 30 volts.

SUMMARY OF THE INVENTION

In accordance with the invention, an improved integrated digital-to-analog converter provides an optionally large terminal voltage range which, in particular, is so large that the terminal voltage can be used for operating varactor diodes in radio and television receivers. Moreover, independent of the value of the voltage from which the terminal voltage is derived, the number of digits of the digital signal as applied to the input of the digital-to-analog converter, corresponds to the entire terminal voltage range. If, for example, a nine-digit binary digital signal is present, it is possible therewith to distinguish $2^9 = 512$ voltage stages. These, independently of the momentary value of the voltage, shall always be completely assigned thereto, irrespectively of whether it just amounts to 30, 31 or only to 28 volts.

Advantageously in accordance with the invention, it is not necessary to connect any components from the outside to the integrated circuit, apart from e.g., the varactor diode to be operated therefrom. Another advantage is that in the case of a positive terminal voltage and, consequently, a positive voltage and a positive operating voltage, npn transistors can be used exclusively in the digital-to-analog converter unit. Accordingly, the integrated circuit in accordance with the invention, apart from the two pnp current sources and some further possibly required pnp transistors, contains exclusively npn transistors and, if so required, an insulated-gate field-effect transistor.

BRIEF DESCRIPTION OF THE DRAWINGS

The invention will now be explained in greater detail with reference to FIGS. 1 to 4 of the accompanying drawings, in which.

DETAILED DESCRIPTION

Figure 1:
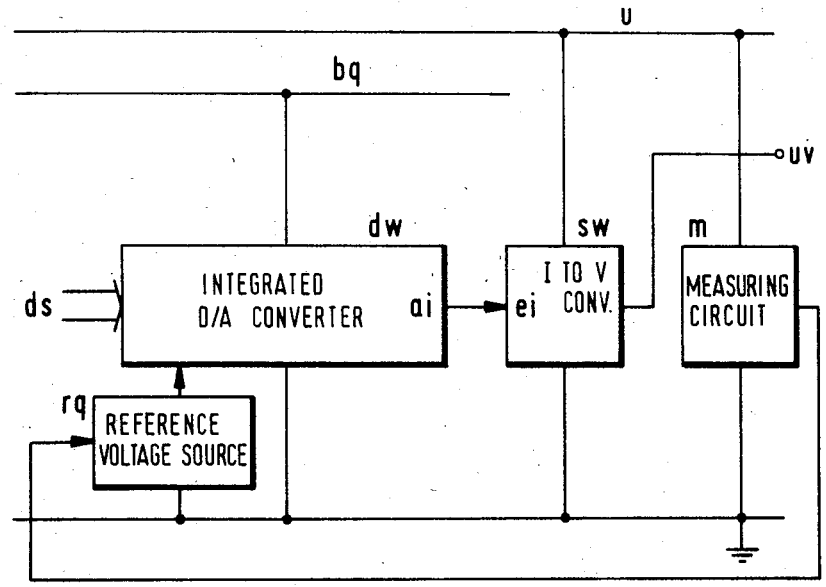
FIG. 1 is a basic circuit block diagram of the integrated circuit according to the invention.
Figure 4:
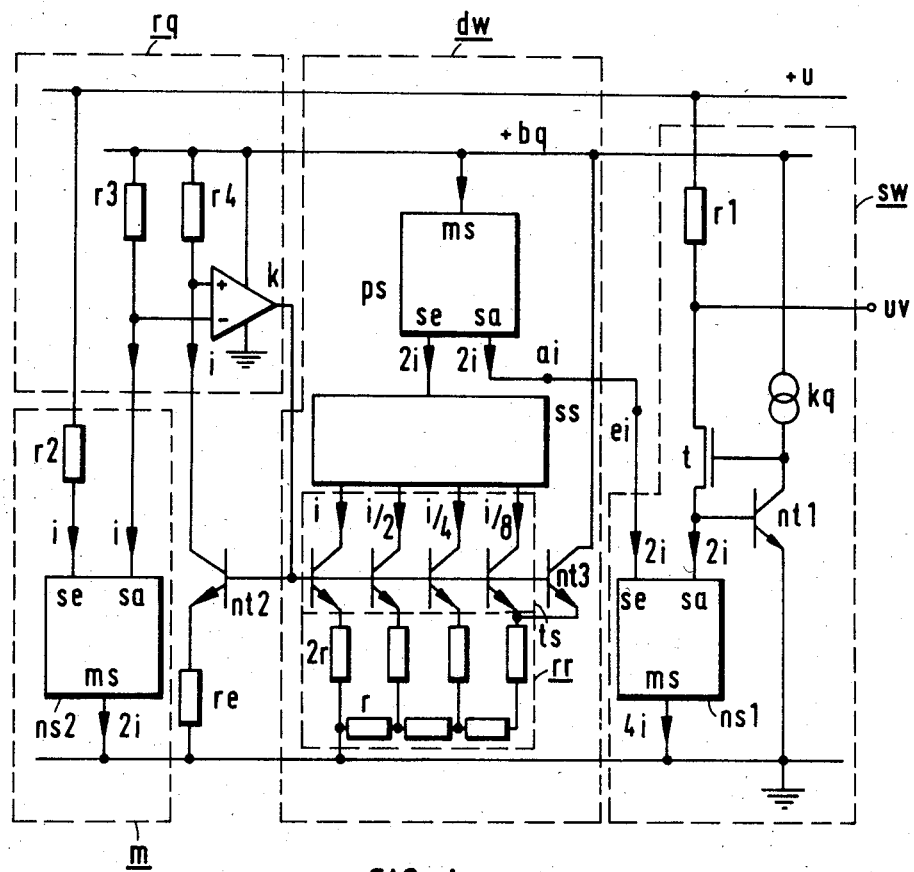
FIG. 4 shows is a partially schematic circuit diagram relating to an embodiment of the invention for a positive voltage and operating voltage.

In the block diagram of FIG. 1 the integrated digital-to-analog (D/A) converter dw has a digital input to which the digital signal ds is fed either in a parallel or in serial form. In FIG. 1 digital signal ds is shown as a parallel input to converter dw. According to a first feature of the invention, the D/A converter dw is operated from a single operating voltage source bq which, for example, according to the embodiment as shown in FIG. 4, may be connected in such a way that the zero point of the circuit is connected to the negative pole thereof, so that, there is a positive operating voltage $+bq$.

According to a further feature of the invention, both the reference voltage source ra and the current-to-voltage converter sw are included in the integrated circuit, that is, these circuit parts are embodied on the same monocrystalline semiconductor body as the digital-to-analog converter dw.

From FIG. 1 it can be seen that the current output ai of the digital-to-analog converter is connected to the current input ei of the current-to-voltage converter sw which, in turn, is operated from the voltage source u from which there is derived the terminal voltage uv which is dependent upon the digital signal ds. The voltage source u, like the operating voltage source bq, is a source of dc voltage of which the same pole is applied to the zero point of the circuit as in the case of the operating voltage source bq. Accordingly, in FIG. 4 the negative pole of the voltage source u is applied to the zero point of the circuit, so that in this case there is the positive voltage $+u$, to which the current-to-voltage converter sw is connected.

The measuring circuit m is connected between voltage source u and the zero point of the circuit. The output signal of measuring circuit m is fed to the source of reference voltage rq so that the maximum value of the digital signal ds is always associated with the voltage u. Unlike prior art control circuits which utilize backward regulation with the aid of the measuring circuit for keeping constant an output signal, the present invention intentionally does not utilize a constant regulation, but intentionally utilizes a forward regulation.

The source of reference voltage rq is connected with one side to the zero point of the circuit and, as already described in the above cited printed publication, controls the current flowing in the converting stages of the digital-to-analog converter dw.

Figure 2:
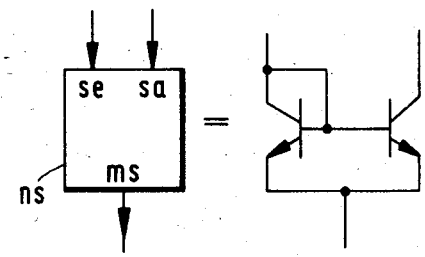
FIG. 2 shows the circuit symbol for a npn current mirror circuit.
Figure 3:
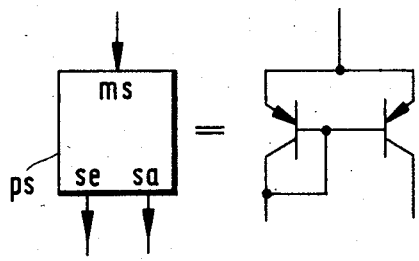
FIG. 3 shows the circuit symbol for a pnp current mirror circuit.

FIGS. 2 and 3 show two circuit symbols used in FIG. 4, for a npn current mirror circuit ns (FIG. 2) and a pnp current mirror circuit ps (FIG. 3), as well as the most simple realization thereof with the aid of two npn or pnp transistors. Accordingly, the most simple current mirror circuit consists of two transistors of the same conductivity type, with the base-emitter paths thereof being connected in parallel, and connected to one another at the one collector and base thereof. The current-mirror property results from the fact that the base-emitter pn junction areas of both transistors are alike. In this case, the same current flows in the two collector-emitter circuits of the transistors, that is, the current flowing in the one transistor "mirrored" in the other. If, however, the base-emitter pn junction areas differ from one another in their sizes, then the current in the one transistor will relate to that in the other transistor in the same relationship as these junction areas. In this case, the circuits are no longer current-mirror circuits, but are current-transformer circuits. If now, as is still to be explained in greater detail hereinafter with reference to FIG. 4, in the one current mirror circuit there is to be mirrored e.g. double the current as in another current mirror circuit, the transistors of this current mirror circuit conducting double the current, must have double the pn junction area as that of the other one.

The above described simple circuit realization, however, does not represent a restriction, because current-mirror circuits of different types are known which comprise two, three and more transistors which, if so required, can likewise be employed with the invention.

For reference purposes the three poles of a current-mirror circuit are referred to herein as the current input se, the current output sa and the summation output ms, with the current input always being that particular terminal to which the transistor with a base-collector connection is connected. The current flowing via the current input se appears mirrored as a current flowing via the current output sa, with the sum of these two currents flowing via the summation output ms.

FIG. 4, partly in the way of a block diagram, shows an embodiment of the invention for a positive voltage and operating voltage, that is, the negative poles of the voltage source u and of the operating voltage source bq according to FIG. 1 are connected to the zero point of the circuit and, consequently, the positive poles thereof are connected to the corresponding circuit parts in FIG. 4. The first pnp current mirror ps is associated with all converting stages of the digital-to-analog converter dw, such that the summation output ms is connected to the positive operating voltage +bq, the current output sa is connected to the input ei of the current-to-voltage converter sw, and that the current input se is connected to all of the switching stages ss. The current output sa is identical with the current output ai of the digital-to-analog converter. The input ei of the current-to-voltage converter sw is identical with the current input se of the first npn current mirror ns1 whose summation output ms is connected to the zero point of the circuit.

Moreover, the voltage converter sw contains the first resistor r1 having one end connected to the positive pole of the voltage source +u. The other end of resistor r1 at which the terminal voltage uv appears is connected to the controlled current path of the transistor t which is voltage stabilized with respect to the voltage u. The controlled current path extends to the current output sa of the first npn current mirror ns1.

The control electrode of the transistor t is connected via the constant current source kq to the positive pole of the source of operating voltage +bq and is also connected via the collector-emitter path of the first npn transistor nt1, to the zero point of the circuit. The base of transistor nt1 is connected to the current output sa of the first npn current mirror ns1. With the aid of the first npn transistor nt1, the terminal voltage deviation is identical with the voltage u offset by the base-emitter threshold voltage of the transistor nt1. Transistor nt1 draws the control electrode of the transistor t to the collector-emitter saturation voltage of the transistor nt1 which is at about 0.1 to 0.2 volt, and therefore is practically identical with the potential of the zero point of the circuit.

The measuring circuit m consists of the second npn current mirror ns2 as well as of the second resistor r2, the one terminal of which is connected to positive voltage +u, and the other terminal of which is connected to the current input se of npn current mirror ns2 whose summation output ms is connected to the zero point of the circuit. The current flowing via the current input se of the current mirror ns2, which is dependent on the voltage of the voltage source +u and the resistance value of the second resistor r2, thus serves as a measure of this voltage.

The source of reference voltage contains the second npn transistor nt2 and the emitter resistor re associated therewith and which, with one side, is connected to the zero point of the circuit. The base electrode of the second npn transistor nt2 is connected to the base electrodes of the transistors ts which are determinative of the current flowing in the individual converting stages. The base-emitter pn junction areas of transistors ts doubling from stage to stage. The current output sa of the second npn current mirror ns2 is connected, across the third resistor r3, and the collector of the second npn transistor nt2 is connected across the fourth resistor r4, to the positive source of operating voltage +bq. The resistance values of the resistors r3 and r4 are preferably alike.

An R-2R type ladder network rr is connected in the emitter circuits of the current-determining transistors ts. The resistors connected to the emitters of transistors ts each have a resistance value 2r, and the resistors connecting these resistors each have the resistance value r. The left most emitter resistor is connected to the zero point of the circuit. A third npn transistor nt3 is used as a terminal element of the R-2R ladder network rr. The base-emitter path of transistor nt3 is connected in parallel with the one of transistors ts in which the smallest current flows, i.e., the one indicated by i/8 (the current associated with the least significant digit of the digital signal ds), and with the collector thereof being connected to the positive source of operating voltage +bq.

The source of reference voltage rq includes the operation amplifier k whose inverting input is connected to resistor r3, and whose noninverting input is connected to resistor r4. The operational amplifier k is supplied with voltage from the positive operating voltage source +bq. With respect to the currents flowing in the individual current-mirror circuits and the circuit parts connected thereto, it is evident that the current i at input se of the second npn current mirror ns2 flowing by repeated mirroring or regulation by means of the operational amplifier is equal to the largest current i of the left most current-determining transistor ts if re=2r and r3=r4, with the full terminal voltage deviation appearing with respect to r2=2r1.

In accordance with the above described area dimensions of the transistors ts, each transistor has one half the current flow of the preceding transistor on the left, so that the sum of the currents of all the transistors ts, which is formed with the aid of the switching stages ss, will in the ideal case approach $2i$, and flow via the current input se of the pnp current mirror ps. This current sum $2i$, again by way of repeated mirroring, causes a current $2i$ to flow in the circuit branch including the first resistor r1 and the transistor t. Thus, it will be easily seen that the current i in the measuring circuit m, proportionately influences the terminal voltage v, with a synchronous influence being effected when the resistance value of the resistor r1 is one half of the resistance value of the resistor r2.

What is claimed is:

1. An integrated circuit comprising:
a first terminal coupled to a first voltage source;
a second terminal coupled to a second voltage source;
a common terminal coupled to said first and second voltage sources;
one or more digital signal input terminals;
an output terminal;
a digital to analog converter coupled to said first terminal and to said common terminal for operation from said first voltage source and having one or more inputs coupled to said one or more digital signal input terminals, and an output;
said digital to analog converter comprising
a plurality of transistors, a resistive ladder network coupled to said plurality of transistors and switching stages responsive to digital signals at said one or more inputs for establishing individual current flows through selected ones of said plurality of transistors the current flow through each of said selected ones of said plurality of transistors being determined by said ladder network, said digital to analog converter providing a current flow at said output which is the sum of said individual currents;
a reference voltage source coupled to said digital to analog converter for determining said individual currents;
a current to voltage converter having an input coupled to said output and providing a voltage output at said output terminal; and
a measuring circuit coupled between said second terminal and said common terminal for measuring the voltage at said second terminal and providing an output to said reference voltage source such that the maximum value representable by said digital signals is associated with the voltage at said second terminal.

2. An integrated circuit in accordance with claim 1 wherein;
said first terminal is at a positive operating voltage relative to said common terminal;
said second terminal is at a positive voltage relative to said common terminal;
said digital to analog converter comprises:
a first pnp current mirror having a summation output coupled to said first terminal, a current output coupled to said current to voltage converter input, and a current input coupled to all of said switching stages; and
said current to voltage converter comprises:
a first npn current mirror having a current input coupled to said first pnp current mirror current output, a summation output coupled to said common terminal and a current output;
a first resistor having one end coupled to said second terminal and its other end coupled to said voltage output terminal;
a transistor voltage stabilized with respect to said positive voltage having a current path coupled between said voltage output terminal and said first pnp current mirror current output, and having a control electrode;
a constant current source coupled between said first terminal and to said control electrode; and
an npn transistor having its collector-emitter path coupled between said constant current source and said common terminal and its base electrode coupled to said first npn current mirror current output.

3. An integrated circuit in accordance with claim 2 wherein said measuring circuit comprises:
a second npn current mirror having a summation output coupled to said common terminal, a current output coupled to said reference voltage source, and a current input; and
a second resistor having one end connected to said second terminal and its other end coupled to said second npn current mirror input, said second resistor having a resistance value twice that of said first resistor.

4. An integrated circuit in accordance with claim 3 wherein said reference voltage source comprising:
a second npn transistor;
an emitter resistor coupling the emitter of said second npn transistor to said common terminal;
a third resistor having one end coupled to said first terminal and its other end coupled to said second npn current mirror current output;
a fourth resistor coupling the collector of said second npn transistor to said first terminal; and
an operational amplifier having a non-inverting input coupled to said second npn transistor collector, an inverting input coupled to said third resistor other end, and an output coupled to the base electrodes of all of said plurality of transistors and to the base electrodes of said second npn transistor.

5. An integrated circuit in accordance with claim 2 wherein said voltage stabilized transistor is an insulated gate field effect transistor.

6. An integrated circuit in accordance with claim 3 wherein said voltage stabilized transistor is an insulated gate field effect transistor.

7. An integrated circuit in accordance with claim 4 wherein said voltage stabilized transistor is an insulated gate field effect transistor.

* * * * *